United States Patent
Kalathil et al.

(10) Patent No.: US 10,122,376 B2
(45) Date of Patent: Nov. 6, 2018

(54) REFERENCE PRECHARGE TECHNIQUES FOR ANALOG-TO-DIGITAL CONVERTERS

(71) Applicant: Analog Devices Global, Hamilton (BM)

(72) Inventors: Anoop Manissery Kalathil, Kuttippuram (IN); Arvind Madan, Bangalore (IN); Sandeep Monangi, Srikakulam (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/711,176

(22) Filed: Sep. 21, 2017

(65) Prior Publication Data

US 2018/0131384 A1    May 10, 2018

Related U.S. Application Data

(60) Provisional application No. 62/417,487, filed on Nov. 4, 2016.

(51) Int. Cl.
| | |
|---|---|
| *H03M 1/12* | (2006.01) |
| *H03M 1/46* | (2006.01) |
| *H03M 1/14* | (2006.01) |
| *H03M 1/80* | (2006.01) |

(52) U.S. Cl.
CPC ........... *H03M 1/462* (2013.01); *H03M 1/124* (2013.01); *H03M 1/14* (2013.01); *H03M 1/145* (2013.01); *H03M 1/466* (2013.01); *H03M 1/804* (2013.01)

(58) Field of Classification Search
CPC ...... H03M 1/462; H03M 1/804; H03M 1/124; H03M 1/466; H03M 1/14; H03M 1/12; H03M 1/00
USPC ................ 341/172, 136, 161, 150, 155, 158
See application file for complete search history.

(56) References Cited

U.S. PATENT DOCUMENTS

| | | | |
|---|---|---|---|
| 7,432,844 B2 * | 10/2008 | Mueck | H03M 1/0682 341/161 |
| 7,961,131 B2 | 6/2011 | Craninckx | |
| 8,390,502 B2 | 3/2013 | Kapusta | |
| 8,441,386 B2 * | 5/2013 | Strode | H03M 1/162 327/382 |
| 8,537,045 B2 | 9/2013 | Kapusta | |
| 8,552,897 B1 * | 10/2013 | Hurrell | H03F 3/45 341/136 |
| 8,754,794 B1 * | 6/2014 | Li | H03M 1/1057 341/118 |
| 9,608,655 B1 * | 3/2017 | Li | H03M 1/069 |
| 9,712,181 B1 * | 7/2017 | Chen | H03M 1/68 |
| 9,806,734 B1 * | 10/2017 | Madan | H03M 1/1245 |

(Continued)

*Primary Examiner* — Jean B Jeanglaude
(74) *Attorney, Agent, or Firm* — Schwegman Lundberg & Woessner, P.A.

(57) ABSTRACT

Systems and methods to reduce the amount of reference current drawn by a SAR ADC by including an auxiliary or precharge reference source. The ADC can connect the bit trial capacitors of a main digital-to-analog converter (DAC) to an auxiliary or precharge reference source during the loading of the bit trials, and then the ADC can switch to a main reference buffer. After allowing enough time for both phases, the main DAC can proceed with the bit trials to resolve the remaining bits. The rest of the bit trials can be performed directly using the main reference buffer.

29 Claims, 6 Drawing Sheets

(56) References Cited

U.S. PATENT DOCUMENTS

| | | | |
|---|---|---|---|
| 2008/0129573 A1* | 6/2008 | Mueck | H03M 1/0682 341/163 |
| 2009/0273501 A1* | 11/2009 | Madhavan | H03M 1/068 341/158 |
| 2013/0249727 A1* | 9/2013 | Hurrell | H03F 3/45 341/150 |
| 2015/0091744 A1* | 4/2015 | Shen | H03M 1/04 341/110 |
| 2016/0182078 A1* | 6/2016 | Shen | H03M 1/08 341/122 |

* cited by examiner

REFERENCE PRECHARGE TECHNIQUES FOR ANALOG-TO-DIGITAL CONVERTERS

CLAIM OF PRIORITY

This application claims the benefit of priority of U.S. Provisional Patent Application Ser. No. 62/417,487, titled "REFERENCE PRECHARGE TECHNIQUES FOR ANALOG-TO-DIGITAL CONVERTERS" to Anoop Manissery Kalathil et al., filed on Nov. 4, 2016, the entire contents of which being incorporated herein by reference.

FIELD OF THE DISCLOSURE

This document pertains generally, but not by way of limitation, to integrated circuits, and more particularly, to Analog-to-Digital Converter (ADC) circuits.

BACKGROUND

An analog-to-digital converter (ADC) circuit can be used to convert an analog signal to a digital signal, which can then be further processed or used in the digital domain. A Successive Approximation Routine (SAR) ADC circuit can carry out bit trials to compare portions of the analog signal to a reference voltage to determine the digital bit values of a digital word representing a particular sample of the analog signal. A SAR ADC can use a capacitor array of a Digital-to-Analog Converter (DAC) for carrying out the bit trials for determining the respective digital bit values of the digital word.

SUMMARY OF THE DISCLOSURE

This disclosure presents techniques to reduce the reference current consumed by an ADC by including an auxiliary or precharge reference source, e.g., precharge reference buffer. The ADC can resolve the first several bits, e.g., the first 3-5 bits, and as described in detail below, the ADC can connect the bit trial capacitors of a main digital-to-analog converter (DAC) to the auxiliary or precharge reference source during the loading of the bit trials. Then the ADC can switch to a main reference buffer. After allowing enough time for both phases, the main DAC can proceed with the bit trials to resolve the remaining bits. The rest of the bit trials can be performed directly using the main reference buffer. As most of the charge from a reference is taken by the capacitors representing the most significant bit (MSB), precharging using an auxiliary reference buffer can significantly reduce the reference current consumed.

In an aspect, this disclosure is directed to a method of operating a successive approximation register (SAR) analog-to-digital converter (ADC) circuit to precharge a bit trial capacitor of a main ADC. The method comprises determining a bit trial result using an auxiliary ADC, the auxiliary ADC configured to resolve K bits of an N-bit digital word; loading the bit trial result onto the bit trial capacitor of the main ADC; connecting a first plate of the bit trial capacitor in the main ADC to a first reference voltage for a first time, the bit trial capacitor representing a bit of the K bits, the main ADC configured to resolve the remaining bits of the N-bit digital word; and after the first time, disconnecting the first plate of the bit trial capacitor from the first reference voltage and connecting the first plate of the bit trial capacitor to a second reference voltage for a second time.

In an aspect, this disclosure is directed to a successive approximation register (SAR) analog-to-digital converter (ADC) circuit for precharging a bit trial capacitor of a main ADC. The circuit comprises an auxiliary ADC configured to resolve K bits of an N-bit digital word; a main ADC configured to resolve the remaining bits of the N-bit digital word, the main ADC including: the bit trial capacitor representing a bit of the N-bit digital word; first and second electronic switches coupled to a plate of the bit trial capacitor. The circuit further comprises control circuitry configured to: determine a bit trial result using the auxiliary ADC; load the at least one bit trial result onto the bit trial capacitor of the main ADC; control the first electronic switch to connect the first plate of the bit trial capacitor of the main ADC to one of a first positive reference voltage or a first negative reference voltage for a first time based on the bit trial result of the auxiliary ADC; and after the first time, control the first electronic switch to disconnect the first plate of the bit trial capacitor from the first positive reference voltage or the first negative reference voltage and control the second electronic switch to connect the first plate of the bit trial capacitor to one of a second positive reference voltage or a second negative reference voltage for a second time based on the bit trial result.

In an aspect, this disclosure is directed to a method of operating a successive approximation register (SAR) analog to digital converter (ADC) integrated circuit device to precharge bit trial capacitors of a main ADC. The method comprises determining a first plurality of bit trial results using an auxiliary ADC; loading the first plurality of bit trial results onto the bit trial capacitors of the main ADC; connecting respective first plates of a corresponding first plurality of capacitors in the main ADC to one of a first positive reference voltage or a first negative reference voltage for a first time, based on the bit trial results, wherein the first plurality of capacitors represent a first plurality of bits of a digital word; during the first time, determining a second plurality of bit trial results using the auxiliary ADC; loading the second plurality of bit trial results onto the bit trial capacitors of the main ADC; after the first time, connecting respective first plates of a corresponding second plurality of capacitors in the main ADC to one of the first positive reference voltage or the first negative reference voltage for a second time, based on the bit trial results, wherein the second plurality of capacitors represent a second plurality of bits of a digital word; and after the second time, disconnecting the first plates of the first and second plurality of capacitors in the main ADC from the first positive reference voltage or the first negative reference voltage and connecting the first plates of the first and second plurality of capacitors in the main ADC to one of a second positive reference voltage or a second negative reference voltage, based on the second plurality of bit trial results.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A SAR ADC converts input voltage into a digital code by successively comparing the sampled input charge with different amounts of reference charge. An approach to a SAR ADC provides the reference charge needed for these comparisons by an on-chip/off-chip reference buffer along with a large off-chip decoupling capacitor e.g., order of 10 microfarads (µF). A consideration is ensuring that the reference value remains relatively stable while the ADC continues to draw reference charge from the decoupling capacitor during a given conversion. The reference buffer, therefore, charges the off-chip capacitor back to reference by the time next conversion starts. The present inventors have recognized, among other things that with this approach there can be various challenges, including limitations on the speed of the SAR ADC, output impedance requirements on the reference buffer, and crosstalk in a multi-channel ADC.

The speed of the SAR ADC can be limited as bit trials tend to be longer as the charge flow from the reference capacitor is limited by bond wire/lead frame inductances. In a given package/technology, SAR ADCs cannot run beyond a given speed with this approach.

Regarding output impedance requirements on the reference buffer, the output impedance of the buffer together with the input dependent reference current drawn by the ADC set the lower bound on the achievable integral nonlinearity (INL). In cases where a reference buffer has to drive high precision ADCS (e.g., greater than 16 bits), the output impedance requirement can be as low as 50 milliohms. When more than one ADC is driven by a single reference buffer, this scenario can become even worse.

Regarding crosstalk in a multi-channel ADC, when a single reference buffer is driving multiple ADCs, the reference value in a critical bit trial of a first ADC can depend on the input of a second ADC. Use of a common reference buffer can lead to crosstalk between different ADCs.

Figure 8:
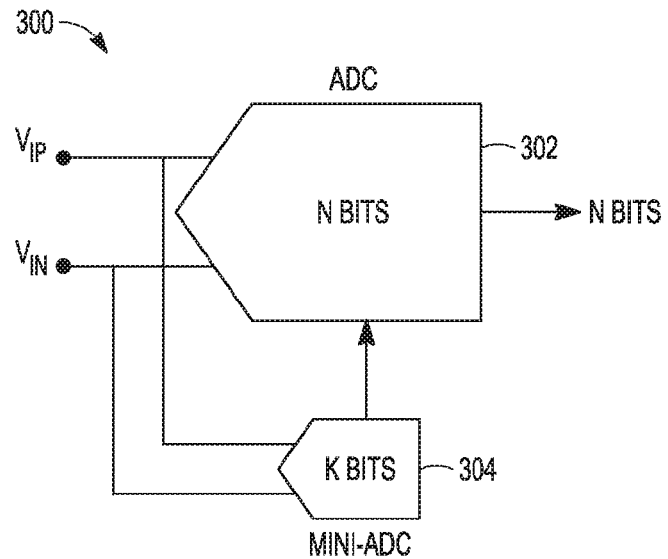
FIG. 8 is a functional block diagram of an example of an ADC having a main ADC and an auxiliary ADC.

An ADC can include an auxiliary ADC (or "mini-ADC") to resolve the first several bits, e.g., the first 3-5 bits, an example of which is shown in FIG. 8. A mini-ADC can help convert higher input voltage ranges using a low voltage supply and can allow the ADC to power down the main comparator during the acquisition phase and provide auto zeroing during the mini-ADC conversion. The results of the mini-ADC can be loaded onto the main DAC and then the main ADC can proceed with its conversion.

This disclosure describes, among other things, techniques to reduce the amount of reference current drawn by an ADC, e.g., a SAR ADC, by including an auxiliary or precharge reference buffer and a mini-ADC. The ADC can connect the bit trial capacitors of a main digital-to-analog converter (DAC) to an auxiliary or precharge reference buffer during the loading of the mini-ADC bit trials, and then the ADC can switch to a main reference buffer. After allowing enough time for both phases, the main DAC can proceed with the bit trials to resolve the remaining bits. The rest of the bit trials can be performed directly using the main reference buffer. As most of the charge from a reference is taken by the capacitors representing the most significant bit (MSB), precharging using an auxiliary reference buffer can significantly reduce the reference current consumed, e.g., 80% reduction. The precharging can also reduce variation in the reference current with respect to input.

Figure 1:
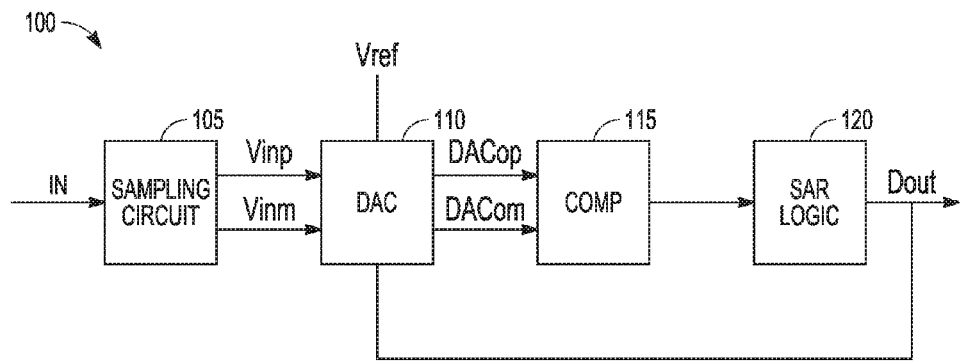
FIG. 1 is a functional block diagram of an example of an SAR ADC.

FIG. 1 is a functional block diagram of an example of an SAR ADC 100. In the example, a differential analog input voltage is sampled and held using sampling circuit 105, and a differential output voltage of a DAC circuit 110 is compared to the sampled and held voltage using comparator circuit 115. The bit values of the DAC circuit 110 are adjusted based on the output of the comparator circuit. The conversion can start with the DAC set to midscale. The comparator 115 determines whether the DAC output is greater or less than the sampled input voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. SAR logic circuitry 120 controls the ADC operation during the bit trials. When the bit trials are complete, the digital value of the sampled and held voltage is available at output Dout.

In some example implementations, the DAC circuit 110 can include two switched capacitor DAC (CDAC) arrays, a first CDAC referred to as "P-DAC" and connected to a non-inverting input of the comparator 115, and a second CDAC referred to as "N-DAC" and connected to an inverting input of the comparator 115. Each CDAC includes a plurality of capacitors, each capacitor having first and second plates.

Each of the capacitors of the CDAC array has an associated switch that is operable to selectively connect a first plate, e.g., the lowermost or "bottom" plate, to either the first reference voltage Vrefp or to the second reference voltage "Vrefn" depending on the bit trial result. Generally Vrefn corresponds to ground and Vrefp is positive relative to Vrefn. In some implementations, the basic SAR algorithm can involve a "Guess->Decide->Set" manner in switching bit trial capacitors. Each bit can be "set", e.g., connected to Vrefp, at the start of that particular bit trial, and based on the bit trial output, that bit setting can be kept or "reset", e.g., connected to Vrefn.

Figure 2:
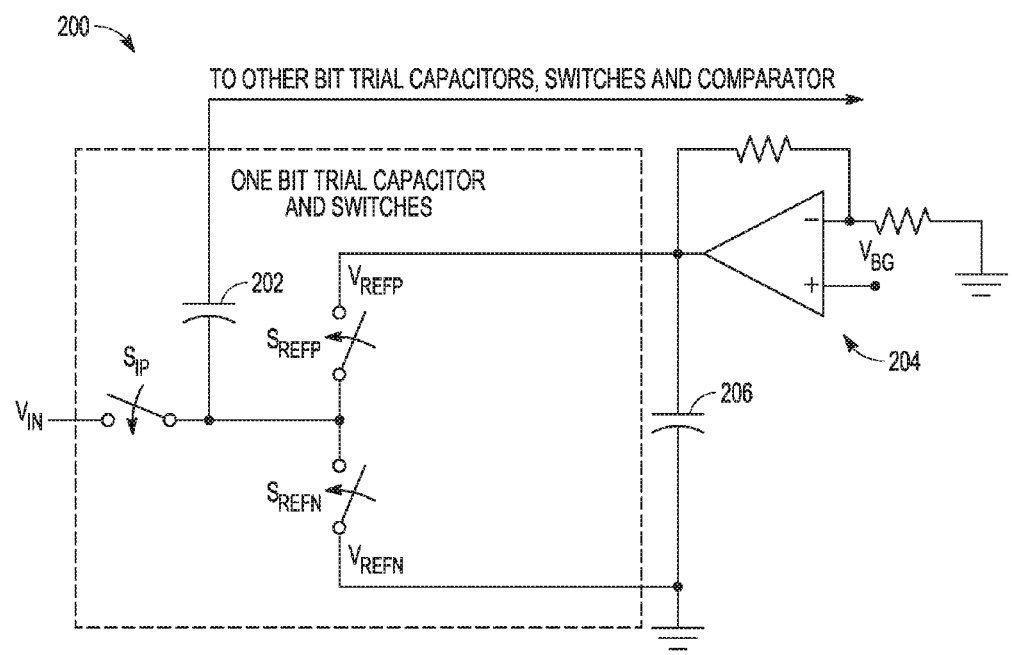
FIG. 2 is a schematic diagram of a portion of an example SAR ADC.

FIG. 2 is a schematic diagram of a portion of an example SAR ADC 200. In particular, FIG. 2 illustrates the bottom plate connections of a single MSB bit trial capacitor 202 in a traditional SAR ADC circuit, for simplicity. A typical ADC can have 12 bit trial capacitors, for example. The right-hand side of FIG. 2 depicts a reference buffer circuit 204 (or "main reference buffer"), e.g., internal or external, that receives and amplifies a bandgap reference voltage $V_{BG}$ input. An external decoupling capacitor 206 is coupled to the output of the reference buffer circuit 204.

The bit trial capacitor 202 can sample an input voltage Vin by closing switch Sip during an acquisition phase. Once the acquisition phase is over, the charge is stored on the bit trial capacitor 202 and switch Sip can be opened. The ADC can perform the bit trials according to the SAR algorithm and depending on the bit trial results, the ADC can control either switch Srefp or Srefn to connect the bottom plate of the capacitor 202 to Vrefp and Vrefn, respectively. For multiple bit trial capacitors, each bit trial capacitor can sample the input voltage Vin and then can be connected to either Vrefp or Vrefn, depending on the results of the bit trial, using separate switches. Whenever a bit trial capacitor, e.g., bit trial capacitor 202, is connected to Vrefp, the bit trial capacitor draws charge from the decoupling capacitor 206.

Figure 3:
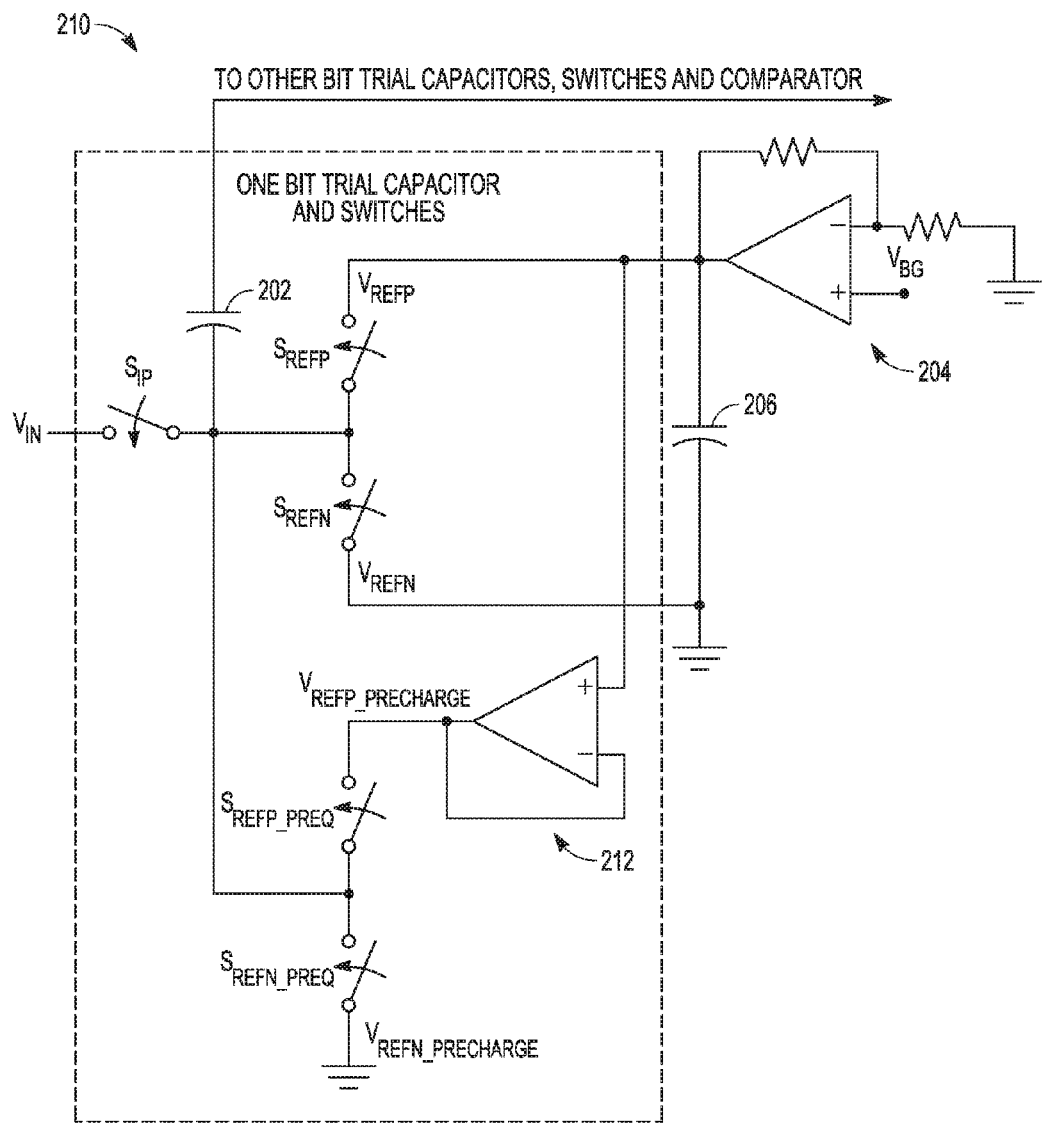
FIG. 3 is a schematic diagram of a portion of an example SAR ADC that includes a precharge circuit.

To reduce the size of the external decoupling capacitor 206, the current drawn from the decoupling capacitor 206 should be reduced. Using the techniques of this disclosure, after the bit trial results, the bit trial capacitors, e.g., bit trial capacitor 202, can first be connected to a voltage that is close to Vrefp or Vrefn before the bit trial capacitor is connected to Vrefp or Vrefn. In this manner, when the bit trial capacitor, e.g., bit trial capacitor 202, is connected to Vrefp or Vrefn, the bit trial capacitor can draw less charge from the decoupling capacitor 206 because it has been precharged to the voltage that is close to Vrefp or Vrefn. FIG. 3 depicts an example of a precharge circuit that can used to implement various techniques of this disclosure.

FIG. 3 is a schematic diagram of a portion of an example SAR ADC 210 that includes a precharge circuit. FIG. 3 illustrates the bottom plate connections of a single MSB bit trial capacitor 202 in a SAR ADC circuit that includes a precharge circuit, for simplicity. Like in FIG. 2, the right-hand side of FIG. 3 depicts a main reference buffer circuit 204, e.g., internal or external, that receives and amplifies a bandgap reference voltage $V_{BG}$ input. An external decoupling capacitor 206 is coupled to the output of the reference buffer circuit 204.

The precharge circuit can include a precharge reference buffer circuit 212, e.g., a high speed internal buffer, a precharge switch Srefp_preq that can connect the bottom plate of the bit trial capacitor 202 to a voltage Vrefp_precharge, and a precharge switch Srefn_preq that can connect the bottom plate of the bit trial capacitor 202 to a voltage Vrefn_precharge, e.g., an internal ground. In the example shown in FIG. 3, there is no capacitor coupled to the output of the precharge reference buffer 212.

When loading the bit trial results of the mini-ADC on the bit trial capacitor, e.g., bit trial capacitor 202, the ADC 210 can temporarily close one of either switch Srefp_preq or switch Srefn_preq to connect the bit trial capacitor to either voltage Vrefp_precharge or voltage Vrefn_precharge, respectively, depending on the bit trial result. In this manner, the ADC 210 can precharge the bit trial capacitor during the phase in which maximum current is drawn. Once a sufficient time has passed to charge the bit trial capacitor to the precharge reference voltage, e.g., about 3-4 nanoseconds, the ADC 210 can open whichever of the precharge switches Srefp_preq or Srefn_preq was closed, and then the ADC 210 can control either main switch Srefp or main switch Srefn to connect the bottom plate of the capacitor 202 to Vrefp and Vrefn, respectively, depending on the bit trial result.

In some implementations, neither a precharge reference buffer circuit nor a mini-ADC is needed. For example, a SAR ADC circuit can include a secondary reference voltage source that is close to the primary reference voltage, e.g., Vrefp or Vrefn, such that a precharge reference buffer is not needed. The ADC can control switching for a first phase and a second phase in which during the first phase, the ADC can connect the bit trial capacitor to the secondary reference voltage source that is close to the primary reference voltage. Then, in the second phase, the ADC can control either main switch Srefp or main switch Srefn to connect the bottom plate of the capacitor 202 to Vrefp and Vrefn, respectively, depending on the bit trial result. To summarize, the ADC can connect a bit trial capacitor to a relatively inaccurate reference voltage, e.g., secondary reference voltage source or precharge reference buffer, and then connect the bit trial capacitor to the accurate primary reference voltage supplied by the main reference buffer. Dividing each or some of the bit trials into two phases can reduce the current drawn from the primary reference, which can be at the expense of the speed of the ADC because each phase of all bit trials have to be given a sufficient settling time.

In some other implementations, the bit trials do need not be divided into two phases. Rather, the first few bit trials can be performed using a relatively inaccurate voltage reference and subsequent bit trials can be performed using a more accurate primary reference voltage supplied by a main reference buffer. Any error that results from the early bit trials by using the relatively inaccurate voltage reference can be corrected by having sufficient redundancy available following these early bit trials. It is desirable that this redundant bit trial(s) also be performed using the more accurate primary reference voltage. To summarize, performing early bit trials using a relatively inaccurate reference can reduce current drawn from the primary reference but at the expense of increased redundancy usage.

Figure 4:
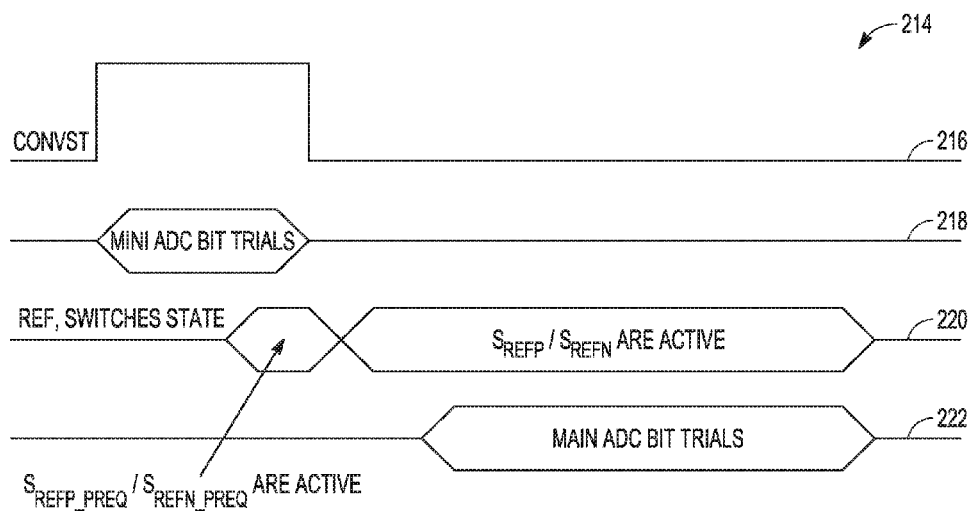
FIG. 4 is a timing diagram for an example of a portion of a SAR ADC that includes a precharge circuit.

FIG. 4 is a timing diagram 214 for an example of a portion of a SAR ADC that includes a precharge circuit. In particular, FIG. 4 depicts an example of the timing between a convert start signal ("Convst") 216, the mini-ADC bit trial results, 218, the reference switch states 220 of the main switches, e.g., Srefp and Srefn, and the precharge switches, e.g., Srefp_preq and Srefn_preq, and the main ADC bit trial results 222.

As seen in FIG. 4, as soon as the convert start signal 216 is received, the mini-ADC bit trials 218 can begin. At the end of the mini-ADC bit trials 218, the precharge switches, e.g., Srefp_preq and switch Srefn_preq, e.g., are active for a time period. The precharge switches can be active when the maximum current is being drawn, which can be when the bit trial results of the mini-ADC (smaller capacitors) are loaded onto the main ADC (larger capacitors). Once the time period is over, the main switches, e.g., Srefp and Srefn, are active. When the main switches are active, the main ADC bit trials can begin. In some examples, the precharge reference buffer, e.g., precharge reference buffer 212 of FIG. 3 can power down as soon as it has finished precharging the bit trial capacitors and can power up again during the next conversion again.

In some implementations, if the mini-ADC is configured to resolve the first 5 or so bits, e.g., of a 12 bit configuration, then the precharge can occur in a phased manner. For example, the first 3 bit trial results of the mini-ADC can be loaded onto respective bit trial capacitors using the precharge reference buffer, e.g., precharge reference buffer 212 of FIG. 3, while the mini-ADC is still resolving the last 2 bits of the 5 bits, then those 2 bit trial results of the mini-ADC can be loaded onto respective bit trial capacitors using the precharge reference buffer.

In some implementations, it can be desirable for the precharge reference buffer 212 to charge the bit trial capacitors of the main ADC within the shortest possible time. In other words, the slew rate of the buffer 212 should be very high in some implementations.

Figure 5:
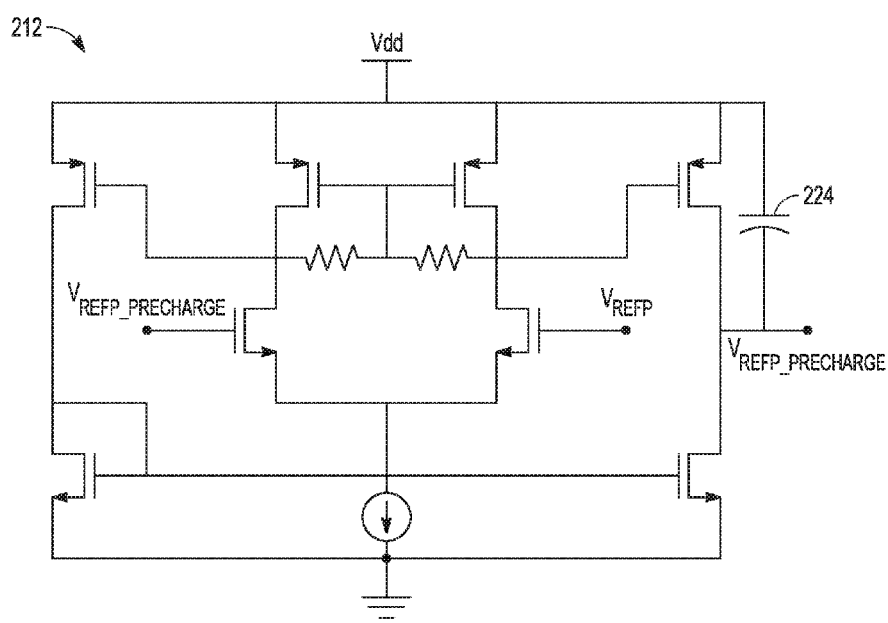
FIG. 5 is a schematic diagram of an example of a reference precharge buffer.

An example non-limiting reference precharge buffer 212 is shown in FIG. 5. Other alternate amplifier configurations can be used and are considered within the scope of this disclosure.

FIG. 5 is a schematic diagram of an example of a precharge reference buffer circuit 212. The precharge reference buffer circuit 212 can be a unity gain buffer and can include an on-chip capacitor 224. The buffer 212 can be realized as a two-stage amplifier having an input voltage Vrefp and an output voltage Vrefp_precharge.

Figure 6:
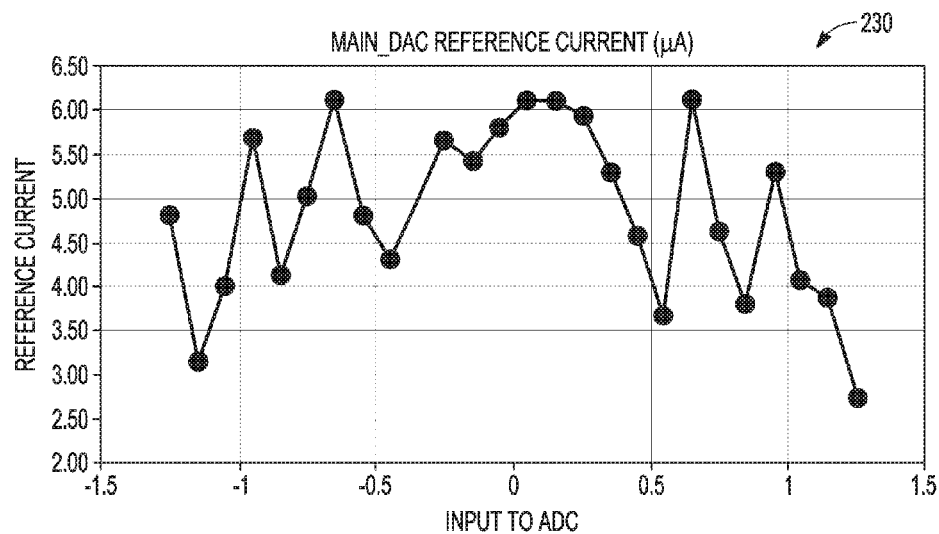
FIG. 6 is a graph depicting a reference current supplied to 5 most significant bits of an ADC by a main reference buffer with a precharge circuit in place.

FIG. 6 is a graph 230 depicting a reference current supplied to 5 bits of an ADC by a main reference buffer with a precharge circuit in place. The x-axis depicts the input to an ADC and the y-axis depicts the reference current in microamps. FIG. 6 depicts a simulated reference current drawn by an ADC from the main voltage reference, e.g., capacitor 206 of FIG. 3. In FIG. 6, a mini-ADC has resolved five bits and the result is loaded onto the main ADC. During the remaining bit trials of the ADC, the 5 bit trial capacitors, e.g., representing 5 MSBs, can still draw a finite amount of current from the reference buffer. It can be observed that the current drawn by the 5 bits, for example, from the main reference buffer has a magnitude of microamps (as compared to several hundreds of microamps in an ADC without a precharge circuit in place) and has little or no dependence on input. This means the requirement on the output impedance of the reference buffer can be relaxed.

Figure 7:
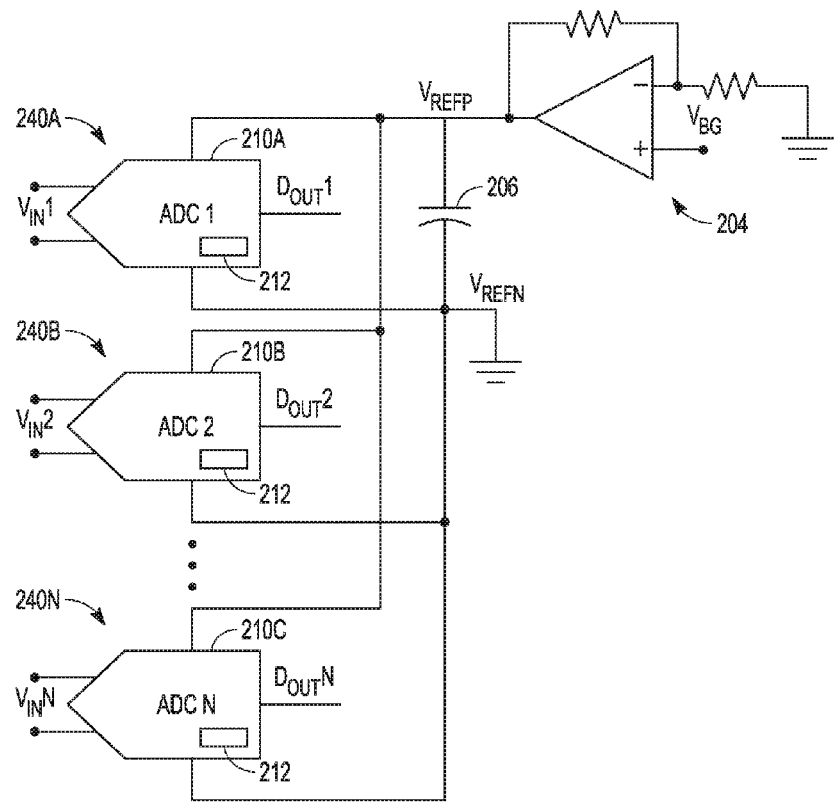
FIG. 7 is a schematic diagram of an example of a configuration of multiple channels having an ADC and a precharge buffer and operating using a common reference.

FIG. 7 is a schematic diagram of an example of a configuration of multiple channels having an ADC and a precharge buffer and operating using a common reference. FIG. 7 depicts channels 240A-240N. Each channel 240 in FIG. 7 can include an ADC configured to receive a voltage input, e.g., $V_{in}1$, $V_{in}2$, and $V_{in}N$, and generate a corresponding digital output, e.g., $D_{out}1$, $D_{out}2$, and $D_{out}N$. Like in FIGS. 2 and 3, the right-hand side of FIG. 7 depicts a main reference buffer circuit 204, e.g., internal or external, that receives and amplifies a bandgap reference voltage $V_{BG}$ input. An external decoupling capacitor 206 can be coupled to the output of the reference buffer circuit 204. The decoupling capacitor 206 can provide a reference for ADC 1 through ADC N, where each of ADC 1 through ADC N has a respective precharge reference buffer circuit 212, e.g., precharge reference buffer circuit 212 of FIG. 3. The configuration depicted in FIG. 7 can operate with a single, smaller reference decoupling capacitor, which can reduce the system footprint.

In some implementations, rather than each of ADC 1 through ADC N including a respective precharge reference buffer circuit, e.g., precharge reference buffer circuit of FIG. 3, all of or some of ADC 1 through ADC N can share a common precharge reference buffer circuit.

FIG. 8 is a functional block diagram of an example of an ADC having a main ADC and an auxiliary ADC. In the example of FIG. 8, a channel 300 can include an ADC that can include a main ADC 302 and an auxiliary ADC or "mini ADC 304." The sampled analog input signal (to be converted into an N-bit digital word), such as the differential signal between Vip and Vin, can be provided to both the mini ADC 304 and the main ADC 302. The mini ADC 304 can be configured to more quickly (than the main ADC 302) resolve the first (e.g., most-significant) K bits of the N bits to be resolved. This can be accomplished using a different mini-ADC type (e.g., a flash ADC 304 and a SAR ADC 302), or by using smaller capacitors in a SAR mini ADC 304, since it need not have the full resolution needed from the main ADC 302, or using another technique. The mini ADC 304 can provide the conversion result of the K bits that it converted to the main ADC 302. This can be used by the main ADC 302.

Figure 9:
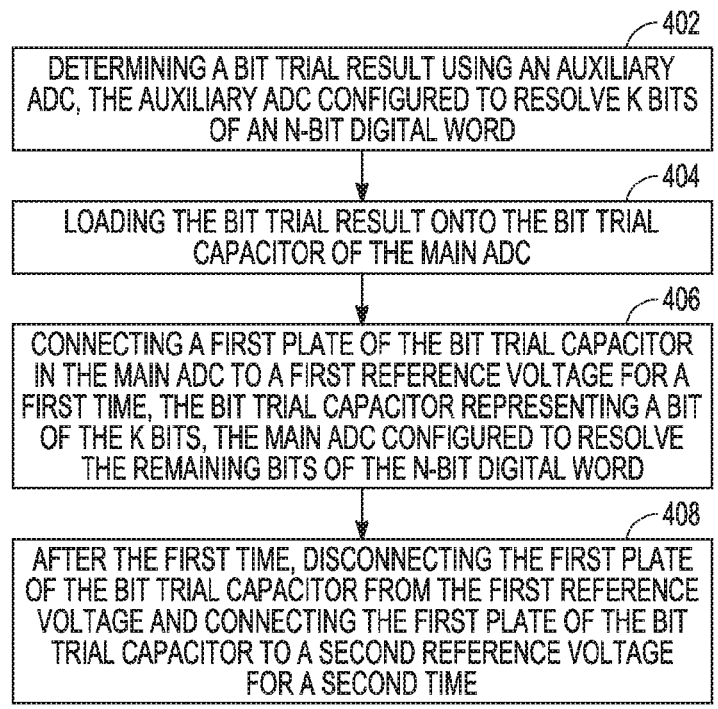
FIG. 9 is a flow diagram representing an example of a method of operating a successive approximation register (SAR) analog to digital converter (ADC) integrated circuit device.

FIG. 9 is a flow diagram representing an example of a method 400 of operating a successive approximation register (SAR) analog to digital converter (ADC) circuit to precharge at least one bit trial capacitor of a main ADC. At block 402, the method 400 can include determining at least one bit trial result using an auxiliary ADC, the auxiliary ADC configured to resolve K bits of an N-bit digital word. For example, an auxiliary ADC, e.g., the auxiliary ADC 304 of FIG. 8, can determine one or more bit trial results from a sampled analog input signal (to be converted into an N-bit digital word), such as the differential signal between Vip and Vin.

At block 404, the method can further include loading a bit trial result onto a bit trial capacitor of the main ADC. For example, control circuitry, e.g., SAR logic circuitry 120 of FIG. 1, can load a bit trial result onto a bit trial capacitor of the main ADC, e.g., the main ADC 302 of FIG. 8. At block 406, the method can include connecting a first plate of the bit trial capacitor in the main ADC to a first reference voltage for a first time, the bit trial capacitor representing a bit of the K bits, the main ADC configured to resolve the remaining bits of the N-bit digital word. For example, control circuitry, e.g., SAR logic circuitry 120 of FIG. 1, can connect a first plate of bit trial capacitor, e.g., capacitor 202, to a first reference voltage, e.g., Vrefn_precharge or Vrefp_precharge of FIG. 3 or to a reference voltage source, by closing a switch, e.g., Srefn_preq or Srefp_preq of FIG. 3, for a first time to precharge the bit trial capacitor.

At block 408, the method can further include, after the first time, disconnecting the first plate of the bit trial capacitor from the first reference voltage and connecting the first plate of the bit trial capacitor to a second reference voltage for a second time. For example, control circuitry, e.g., SAR logic circuitry 120 of FIG. 1, can disconnect a first plate of bit trial capacitor, e.g., capacitor 202, from the first reference voltage, e.g., Vrefn_precharge or Vrefp_precharge of FIG. 3 or to a reference voltage source, by opening the switch, e.g., Srefn_preq or Srefp_preq of FIG. 3, and then connect the first plate of the bit trial capacitor to a second reference voltage, e.g., Vrefn or Vrefp of FIG. 3, by closing a switch, e.g., Srefn or Srefp of FIG. 3, for a second time.

In some aspects, connecting a first plate of the bit trial capacitor in the main ADC to a first reference voltage for a first time, and disconnecting the first plate of the bit trial capacitor from the first voltage source and connecting the first plate of the bit trial capacitor to a second reference voltage for a second time can include: 1) if the bit trial result represents a "1" bit, connecting the first plate of the bit trial capacitor in the main ADC to a positive precharge reference voltage for a first time, and disconnecting the first plate of the bit trial capacitor from the positive precharge reference voltage and connecting the first plate of the bit trial capacitor to a positive main reference voltage for a second time; and 2) if the bit trial result represents a "0" bit, connecting the first plate of the bit trial capacitor in the main ADC to a negative precharge reference voltage for a first time, and disconnecting the first plate of the bit trial capacitor from the negative precharge reference voltage and connecting the first plate of the bit trial capacitor to a negative main reference voltage for a second time. In some aspects, the positive precharge reference voltage can be less accurate than the positive main reference voltage, and the negative precharge reference voltage can less accurate than the negative main reference voltage.

In some aspects connecting a first plate of a capacitor in a main ADC to a first reference voltage for a first time can include connecting a first plate of a capacitor in a main ADC to a first reference voltage for a first time to a precharge reference buffer circuit, and connecting the first plate of the capacitor to a second reference voltage for a second time can include connecting the first plate of a capacitor to a main reference buffer circuit for a second time. In some example implementations, the precharge reference buffer circuit can less accurate than the main reference buffer circuit.

In some aspects, connecting a first plate of a capacitor in a main ADC to a first reference voltage can include connecting a first plate of a capacitor in the main ADC to a first reference voltage source for a first time, and connecting the first plate of the capacitor to a second reference voltage for a second time can include connecting the first plate of the capacitor to a second reference voltage source for a second time. In some example implementations, the first reference voltage source can be less accurate than the second reference voltage source.

In some optional aspects, the SAR ADC can include at least a first channel and a second channel, e.g., as shown in FIG. 7. The first channel, e.g., channel 240A, can include an auxiliary ADC 212 and a main ADC 210A, and the second channel, e.g., channel 240B, can include a second auxiliary ADC 212 and a second main ADC 210B. The method 400 can further include parallel operation of the channels 240A, 240B such that during a time at least partially overlapping with the determining, loading, connecting, disconnecting, and connecting of the first channel: determining a second bit trial result using the second auxiliary ADC; loading the second bit trial result determined using the second auxiliary ADC onto a bit trial capacitor of the second main ADC; connecting a first plate of the bit trial capacitor in the second main ADC to one of the first positive reference voltage or the first negative reference voltage for the first time, based on the second bit trial result of the second auxiliary ADC; and after the first time, disconnecting the first plate of the bit trial capacitor in the second main ADC from the first positive reference voltage or the first negative reference voltage and connecting the first plate of the bit trial capacitor in the second main ADC to one of the second positive reference voltage or the second negative reference voltage for the second time, based on the second bit trial result of second auxiliary ADC.

Figure 10:
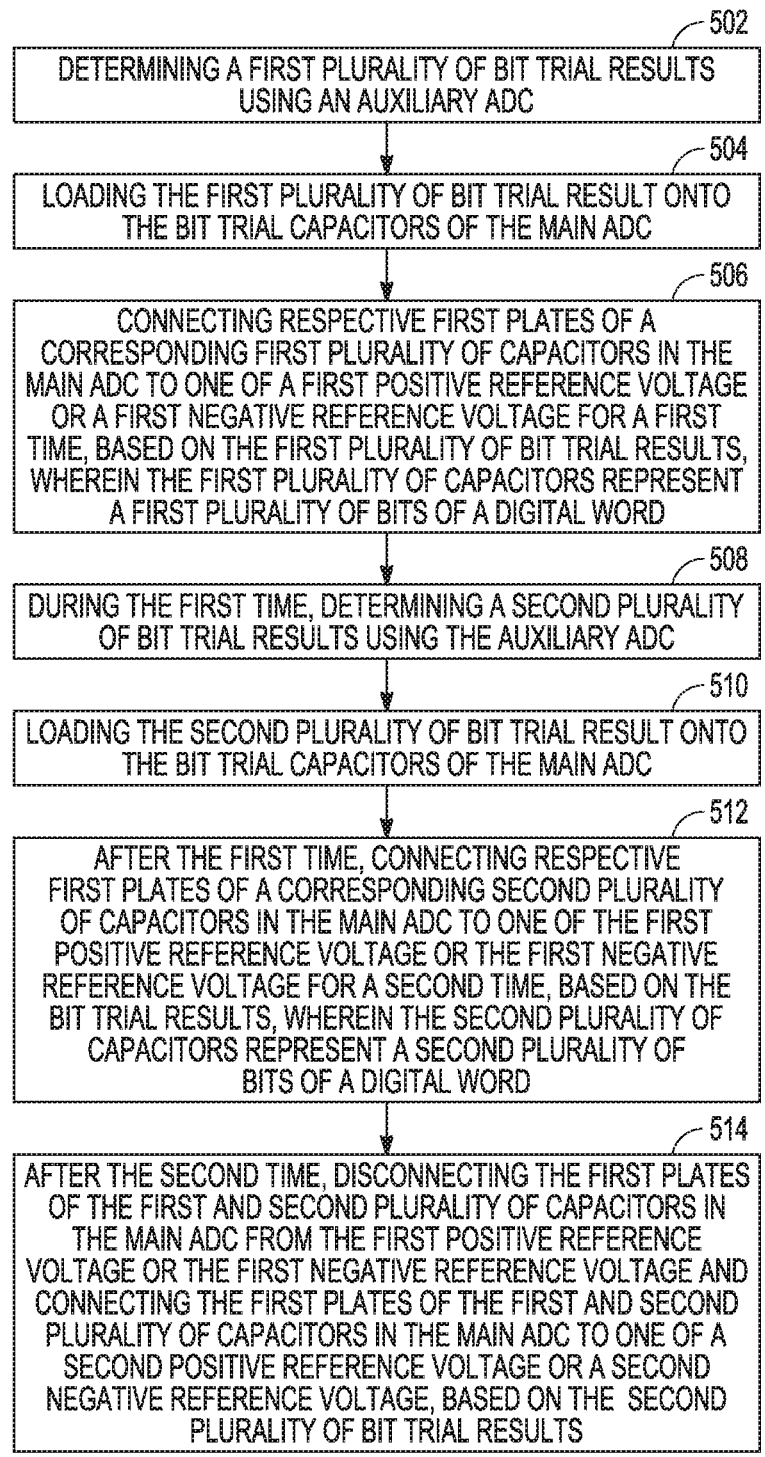
FIG. 10 is a flow diagram representing another example of a method of operating a successive approximation register (SAR) analog to digital converter (ADC) integrated circuit device.

FIG. 10 is a flow diagram representing an example of a method 500 of operating a successive approximation register (SAR) analog to digital converter (ADC) circuit to precharge at least one bit trial capacitor of a main ADC. The method 500 can be used to implement a staggered precharging approach, for example.

At block 502, the method can include determining a first plurality of bit trial results using an auxiliary ADC. For example, an auxiliary ADC, e.g., the auxiliary ADC 304 of FIG. 8, can determine one or more bit trial results from a sampled analog input signal (to be converted into an N-bit digital word), such as the differential signal between Vip and Vin.

At block 504, the method can include loading the first plurality of bit trial result onto the bit trial capacitors of the main ADC. For example, control circuitry, e.g., SAR logic circuitry 120 of FIG. 1, can load the bit trial result(s) onto the bit trial capacitor(s) of the main ADC, e.g., the main ADC 302 of FIG. 8.

At block 506, the method can include connecting respective first plates of a corresponding first plurality of capacitors in the main ADC to one of a first positive reference voltage or a first negative reference voltage for a first time, based on the bit trial results, wherein the first plurality of capacitors represent a first plurality of bits of a digital word. For example, control circuitry, e.g., SAR logic circuitry 120 of FIG. 1, can connect a first plate of bit trial capacitor, e.g., capacitor 202, to one of a first positive reference voltage or a first negative reference voltage, e.g., Vrefp_precharge or Vrefn_precharge of FIG. 3 (or to a reference voltage source), by closing a switch, e.g., Srefp_preq or Srefn_preq of FIG. 3, for a first time to precharge the bit trial capacitor.

At block 508, the method can include during the first time, determining a second plurality of bit trial results using the auxiliary ADC. For example, an auxiliary ADC, e.g., the auxiliary ADC 304 of FIG. 8, can determine one or more second bit trial results from the sampled analog input signal (to be converted into an N-bit digital word), such as the differential signal between Vip and Vin.

At block 510, the method can include loading the second plurality of bit trial result onto the bit trial capacitors of the main ADC. For example, control circuitry, e.g., SAR logic circuitry 120 of FIG. 1, can load the bit trial result(s) onto the bit trial capacitor(s) of the main ADC, e.g., the main ADC 302 of FIG. 8.

At block 512, after the first time, the method can include connecting respective first plates of a corresponding second plurality of capacitors in the main ADC to one of the first positive reference voltage or the first negative reference voltage for a second time, based on the bit trial results, where the second plurality of capacitors represent a second plurality of bits of a digital word. For example, control circuitry, e.g., SAR logic circuitry 120 of FIG. 1, can connect a first plate of bit trial capacitor, e.g., capacitor 202, to one of the first positive reference voltage, or the first negative reference voltage, e.g., Vrefp_precharge or Vrefp_precharge of FIG. 3 (or to a reference voltage source), by closing the switch, e.g., Srefp_preq or Srefn_preq of FIG. 3, for a second time to precharge the bit trial capacitor.

At block 514, the method can include after the second time, disconnecting the first plates of the first and second plurality of capacitors in the main ADC from the first positive reference voltage or the first negative reference voltage and connecting the first plates of the first and second plurality of capacitors in the main ADC to one of a second positive reference voltage or a second negative reference voltage, based on the bit trial results. For example, control circuitry, e.g., SAR logic circuitry 120 of FIG. 1, can disconnect a first plate of bit trial capacitor, e.g., capacitor 202, from the first positive reference voltage or the first negative reference voltage, e.g., Vrefp_precharge or Vrefn_precharge of FIG. 3 (or from a reference voltage source), by opening the switch, e.g., Srefp_preq or Srefn_preq of FIG. 3, and then to one of the second positive reference voltage or the second negative reference voltage, e.g., Vrefp or Vrefn of FIG. 3, by closing a switch, e.g., Srefp or Srefn of FIG. 3, for a second time.

In some aspects of the method of FIG. 10, connecting respective first plates of the corresponding first plurality of capacitors in the main ADC to the one of the first reference positive reference voltage or the first negative reference voltage for the first time can optionally include connecting respective first plates of the corresponding first plurality of capacitors in the main ADC to a precharge reference buffer circuit for a first time, and connecting respective first plates of the corresponding first plurality of capacitors in the main ADC to the one of the second reference positive reference voltage or the second negative reference voltage after the second time can optionally include connecting respective first plates of the corresponding first plurality of capacitors in the main ADC to a main reference buffer circuit after the second time. In some implementations, the precharge reference buffer is less accurate than the main reference buffer.

In other aspects of the method of FIG. 10, connecting respective first plates of the corresponding first plurality of capacitors in the main ADC to the one of the first reference positive reference voltage or the first negative reference voltage for the first time can include connecting respective first plates of the corresponding first plurality of capacitors in the main ADC to the first reference voltage source for the first time, and connecting respective first plates of the corresponding first plurality of capacitors in the main ADC to the one of the second reference positive reference voltage or the second negative reference voltage after second time can include connecting respective first plates of the corresponding first plurality of capacitors in the main ADC to a second reference voltage source after the second time. In some implementations, the first reference voltage source is less accurate than the second reference voltage source.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of operating a successive approximation register (SAR) analog-to-digital converter (ADC) circuit to precharge a bit trial capacitor of a main ADC, the method comprising:

determining a bit trial result using an auxiliary ADC, the auxiliary ADC configured to resolve K bits of an N-bit digital word;

loading the bit trial result onto the bit trial capacitor of the main ADC;

connecting a first plate of the bit trial capacitor in the main ADC to a first reference voltage for a first time, the bit trial capacitor representing a bit of the K bits, the main ADC configured to resolve the remaining bits of the N-bit digital word; and after the first time, disconnecting the first plate of the bit trial capacitor from the first reference voltage and connecting the first plate of the bit trial capacitor to a second reference voltage for a second time.

2. The method of claim 1, wherein connecting the first plate of the bit trial capacitor in the main ADC to the first reference voltage for the first time, and wherein disconnecting the first plate of the bit trial capacitor from the first reference voltage and connecting the first plate of the bit trial capacitor to a second reference voltage for a second time includes:
    if the bit trial result represents a "1" bit, connecting the first plate of the bit trial capacitor in the main ADC to a first positive reference voltage for a first time, and disconnecting the first plate of the bit trial capacitor from the first positive reference voltage and connecting the first plate of the bit trial capacitor to a second positive reference voltage for a second time; and
    if the bit trial result represents a "0" bit, connecting the first plate of the bit trial capacitor in the main ADC to a first negative reference voltage for a first time, and disconnecting the first plate of the bit trial capacitor from the first negative reference voltage and connecting the first plate of the bit trial capacitor to a second negative reference voltage for a second time.

3. The method of claim 1, wherein connecting the first plate of the bit trial capacitor in the main ADC to the first reference voltage for the first time includes:
    connecting the first plate of the bit trial capacitor in the main ADC to a precharge reference buffer circuit for the first time, and
    wherein connecting the first plate of the bit trial capacitor to the second reference voltage for the second time includes:
    connecting the first plate of the bit trial capacitor to a main reference buffer circuit for the second time.

4. The method of claim 3, wherein the precharge reference buffer circuit is less accurate than the main reference buffer circuit.

5. The method of claim 1, wherein connecting the first plate of the bit trial capacitor in the main ADC to the first reference voltage includes:
    connecting the first plate of the bit trial capacitor in the main ADC to a first reference voltage source for the first time, and
    wherein connecting the first plate of the bit trial capacitor to the second reference voltage for the second time includes:
    connecting the first plate of the bit trial capacitor to a second reference voltage source for the second time.

6. The method of claim 5, wherein the first reference voltage source is less accurate than the second reference voltage source.

7. The method of claim 1, wherein the SAR ADC includes a first channel and a second channel, wherein the bit trial result is a first bit trial result, wherein the first channel includes the auxiliary ADC and the main ADC, and wherein the second channel includes a second auxiliary ADC and a second main ADC, wherein the first channel and the second channel are configured to share the second reference voltage, wherein the first reference voltage includes a first positive reference voltage and a first negative reference voltage, wherein the second reference voltage includes a second positive reference voltage and a second negative reference voltage, and wherein the second reference voltage is more accurate than the first reference voltage, the method further comprising:
    during a time at least partially overlapping with the determining, loading, connecting, disconnecting, and connecting of the first channel:
        determining a second bit trial result using the second auxiliary ADC;
        loading the second bit trial result determined using the second auxiliary ADC onto a bit trial capacitor in the second main ADC;
        connecting a first plate of the bit trial capacitor in the second main ADC to one of the first positive reference voltage or the first negative reference voltage for the first time, based on the second bit trial result of the second auxiliary ADC; and
        after the first time, disconnecting the first plate of the bit trial capacitor in the second main ADC from the first positive reference voltage or the first negative reference voltage and connecting the first plate of the bit trial capacitor in the second main ADC to one of the second positive reference voltage or the second negative reference voltage for the second time, based on the second bit trial result of second auxiliary ADC.

8. A successive approximation register (SAR) analog-to-digital converter (ADC) circuit for precharging a bit trial capacitor of a main ADC, the circuit comprising:
    an auxiliary ADC configured to resolve K bits of an N-bit digital word;
    a main ADC configured to resolve the remaining bits of the N-bit digital word, the main ADC including:
        the bit trial capacitor representing a bit of the N-bit digital word;
        first and second electronic switches coupled to a plate of the bit trial capacitor; and
    control circuitry configured to:
        determine a bit trial result using the auxiliary ADC;
        load the at least one bit trial result onto the bit trial capacitor of the main ADC;
        control the first electronic switch to connect the first plate of the bit trial capacitor of the main ADC to one of a first positive reference voltage or a first negative reference voltage for a first time based on the bit trial result of the auxiliary ADC; and
        after the first time, control the first electronic switch to disconnect the first plate of the bit trial capacitor from the first positive reference voltage or the first negative reference voltage and control the second electronic switch to connect the first plate of the bit trial capacitor to one of a second positive reference voltage or a second negative reference voltage for a second time based on the bit trial result.

9. The circuit of claim 8, wherein at least one of the first positive reference voltage and the first negative reference voltage includes a precharge reference buffer circuit.

10. The circuit of claim 9, wherein at least one of the second positive reference voltage and the second negative reference voltage includes a main reference buffer circuit.

11. The circuit of claim 10, wherein the precharge reference buffer circuit is less accurate than the main reference buffer circuit.

12. The circuit of claim 8, wherein at least one of the first positive reference voltage and the first negative reference voltage includes a first reference voltage source.

13. The circuit of claim 12, wherein at least one of the second positive reference voltage and the second negative reference voltage includes a second reference voltage source.

14. The circuit of claim 13, wherein the first positive reference voltage is less accurate than the second positive reference voltage and the first negative reference voltage is less accurate than the second negative reference voltage.

15. The circuit of claim 8, wherein the SAR ADC includes a first channel and a second channel, wherein the bit trial result is a first bit trial result, wherein the first channel includes the auxiliary ADC and the main ADC, wherein the second channel includes a second auxiliary ADC and a second main ADC, wherein the first channel and the second channel are configured to share the second reference voltage, wherein the first reference voltage includes a first positive reference voltage and a first negative reference voltage, wherein the second reference voltage includes a second positive reference voltage and a second negative reference voltage, wherein the second reference voltage is more accurate than the first reference voltage, wherein, during a time at least partially overlapping with the determining, loading, connecting, disconnecting, and connecting of the first channel, the control circuitry is further configured to:
  determine a second bit trial result using the second auxiliary ADC;
  load the second bit trial result determined using the second auxiliary ADC onto a bit trial capacitor in the second main ADC;
  connect a first plate of the bit trial capacitor in the second main ADC to one of the first positive reference voltage or the first negative reference voltage for the first time, based on the second bit trial result; and
  after the first time, disconnect the first plate of the bit trial capacitor in the second main ADC from the first positive reference voltage or the first negative reference voltage and connect the first plate of the bit trial capacitor in the second main ADC to one of the second positive reference voltage or the second negative reference voltage for the second time, based on the second plurality of bit trial results.

16. A method of operating a successive approximation register (SAR) analog to digital converter (ADC) integrated circuit device to precharge bit trial capacitors of a main ADC, the method comprising:
  determining a first plurality of bit trial results using an auxiliary ADC;
  loading the first plurality of bit trial results onto the bit trial capacitors of the main ADC;
  connecting respective first plates of a corresponding first plurality of capacitors in the main ADC to one of a first positive reference voltage or a first negative reference voltage for a first time, based on the bit trial results, wherein the first plurality of capacitors represent a first plurality of bits of a digital word;
  during the first time, determining a second plurality of bit trial results using the auxiliary ADC;
  loading the second plurality of bit trial results onto the bit trial capacitors of the main ADC;
  after the first time, connecting respective first plates of a corresponding second plurality of capacitors in the main ADC to one of the first positive reference voltage or the first negative reference voltage for a second time, based on the bit trial results, wherein the second plurality of capacitors represent a second plurality of bits of a digital word; and
  after the second time, disconnecting the first plates of the first and second plurality of capacitors in the main ADC from the first positive reference voltage or the first negative reference voltage and connecting the first plates of the first and second plurality of capacitors in the main ADC to one of a second positive reference voltage or a second negative reference voltage, based on the second plurality of bit trial results.

17. The method of claim 16, wherein connecting respective first plates of the corresponding first plurality of capacitors in the main ADC to the one of the first reference positive reference voltage or the first negative reference voltage for the first time includes:
  connecting respective first plates of the corresponding first plurality of capacitors in the main ADC to a precharge reference buffer circuit for a first time, and
wherein connecting respective first plates of the corresponding first plurality of capacitors in the main ADC to the one of the second reference positive reference voltage or the second negative reference voltage after the second time includes:
  connecting respective first plates of the corresponding first plurality of capacitors in the main ADC to a main reference buffer circuit after the second time.

18. The method of claim 17, wherein the precharge reference buffer is less accurate than the main reference buffer.

19. The method of claim 16, wherein connecting respective first plates of the corresponding first plurality of capacitors in the main ADC to the one of the first reference positive reference voltage or the first negative reference voltage for the first time includes:
  connecting respective first plates of the corresponding first plurality of capacitors in the main ADC to the first reference voltage source for the first time, and
wherein connecting respective first plates of the corresponding first plurality of capacitors in the main ADC to the one of the second reference positive reference voltage or the second negative reference voltage after second time includes:
  connecting respective first plates of the corresponding first plurality of capacitors in the main ADC to a second reference voltage source after the second time.

20. The method of claim 19, wherein the first reference voltage source is less accurate than the second reference voltage source.

21. The method of claim 1, wherein determining a bit trial result using an auxiliary ADC includes:
  determining a bit trial result using a flash ADC.

22. The circuit of claim 8, wherein the auxiliary ADC is a flash ADC.

23. The method of claim 16, wherein determining a first plurality of bit trial results using an auxiliary ADC includes:
  determining a first plurality of bit trial results using a flash ADC.

24. A method of operating a successive approximation register (SAR) analog-to-digital converter (ADC) circuit to precharge bit trial capacitors, the method comprising:
  determining K bit trial results of an N-bit digital word using a digital-to-analog converter (DAC) circuit;
  connecting first plates of corresponding respective K bit trial capacitors in the DAC circuit to a first reference voltage for a first time, each of the K bit trial capacitors representing a bit of the N bits;
  after the first time, disconnecting first plates of the K bit trial capacitors from the first reference voltage and connecting the first plates of the corresponding respective K bit trial capacitors to a second reference voltage for a second time;
  determining the remaining (N-K) bit trial results of the N-bit digital word using the DAC circuit; and
  connecting first plates of corresponding respective (N-K) bit trial capacitors in the DAC circuit to the second reference voltage.

25. The method of claim 24, wherein connecting the first plates of the corresponding respective K bit trial capacitors in the DAC circuit to the first reference voltage for the first time includes:
connecting the first plates of the corresponding respective K bit trial capacitors in the DAC circuit to a precharge reference buffer circuit for the first time, and wherein connecting the first plate of the bit trial capacitor to the second reference voltage for the second time includes:
connecting the first plates of the corresponding respective K bit trial capacitors to a main reference buffer circuit for the second time.

26. The method of claim 25, wherein the precharge reference buffer circuit is less accurate than the main reference buffer circuit.

27. A successive approximation register (SAR) analog-to-digital converter (ADC) circuit for precharging bit trial capacitors, the circuit comprising:
a digital-to-analog converter (DAC) circuit configured to resolve N bits of an N-bit digital word, the DAC circuit including:
bit trial capacitors representing bits of the N-bit digital word;
electronic switches coupled to first plates of corresponding respective hit ial capacitors;
and control circuitry configured to:
determine K bit trial results of the N-bit digital word using the DAC circuit;
control the electronic switches to connect first plates of corresponding respective 1 bit trial capacitors in the DAC circuit to a first reference voltage for a first time, each of the K bit trial capacitors representing a bit of the N bits;
after the first time, control the electronic switches to disconnect first plates of the K bit trial capacitors from the first reference voltage and connect the first plates of the corresponding respective K bit trial capacitors to a second reference voltage for a second time;
determine the remaining(N-K) bit trial results of the N-bit digital word using the DAC circuit; and
control the electronic switches to connect first plates of corresponding respective (N-K) bit trial capacitors in the DAC circuit to the second reference voltage.

28. The circuit of claim 27, wherein at least one of the first positive reference voltage and the first negative reference voltage includes a precharge reference buffer circuit, and wherein at least one of the second positive reference voltage and the second negative reference voltage includes a main reference buffer circuit.

29. The circuit of claim 28, wherein the precharge reference buffer circuit is less accurate than the main reference buffer circuit.

* * * * *

UNITED STATES PATENT AND TRADEMARK OFFICE
CERTIFICATE OF CORRECTION

PATENT NO. : 10,122,376 B2
APPLICATION NO. : 15/711176
DATED : November 6, 2018
INVENTOR(S) : Kalathil et al.

Page 1 of 1

It is certified that error appears in the above-identified patent and that said Letters Patent is hereby corrected as shown below:

In the Claims

In Column 17, Line 7, in Claim 25, after "and", insert --¶--

In Column 17, Line 25, in Claim 27, delete "hit ial capacitors;" and insert --bit trial capacitors; and-- therefor In Column 17, Line 26, in Claim 27, before "control", delete "and"

In Column 18, Line 2, in Claim 27, delete "I" and insert --K-- therefor

In Column 18, Line 12, in Claim 27, delete "remaining(N-K)" and insert --remaining (N-K)-- therefor Signed and Sealed this
Twenty-fourth Day of March, 2020

Andrei Iancu
*Director of the United States Patent and Trademark Office*